(12) United States Patent
Tanizawa (10) Patent No.: US 7,755,346 B2
(45) Date of Patent: Jul. 13, 2010

(54) MOUNTING STRUCTURE FOR CURRENT SENSOR

(75) Inventor: Yukihiko Tanizawa, Kariya (JP)

(73) Assignee: Denso Corporation, Kariya (JP)

( * ) Notice: Subject to any disclaimer, the term of this patent is extended or adjusted under 35 U.S.C. 154(b) by 1022 days.

(21) Appl. No.: 11/491,985

(22) Filed: Jul. 25, 2006

(65) Prior Publication Data

US 2007/0025065 A1    Feb. 1, 2007

(30) Foreign Application Priority Data

Aug. 1, 2005    (JP)    ............................ 2005-223297

(51) Int. Cl.
*G01R 33/00* (2006.01)
(52) U.S. Cl. ................................. 324/117 H
(58) Field of Classification Search ................ 439/754; 324/117 R, 117 H
See application file for complete search history.

(56) References Cited

U.S. PATENT DOCUMENTS

| | | | | |
|---|---|---|---|---|
| 1,946,862 | A * | 2/1934 | Koch, Jr. | ..................... 439/791 |
| 4,675,255 | A * | 6/1987 | Pfeifer et al. | ................ 429/92 |
| 6,551,147 | B2 * | 4/2003 | Wakata et al. | ............... 439/754 |
| 6,717,396 | B2 * | 4/2004 | Viola | ..................... 324/117 R |
| 7,344,420 | B2 * | 3/2008 | Tokunaga | .................... 439/754 |
| 7,456,616 | B2 * | 11/2008 | Harmon et al. | ................ 322/27 |
| 7,491,097 | B2 * | 2/2009 | Ishihara et al. | .............. 439/763 |
| 2006/0175087 | A1 | 8/2006 | Schelling et al. | |

FOREIGN PATENT DOCUMENTS

| | | |
|---|---|---|
| JP | A-3-48778 | 3/1991 |
| JP | A-9-127159 | 5/1997 |
| JP | A-10-189372 | 7/1998 |
| JP | A-2004-219303 | 8/2004 |
| JP | A-2005-315795 | 11/2005 |
| WO | WO 03/101169 | * 12/2003 |

OTHER PUBLICATIONS

Office Action mailed on Aug. 25, 2009 from the Japan Patent Office for corresponding application No. 2005-223297 (English translation enclosed).

* cited by examiner

*Primary Examiner*—Neil Abrams
(74) *Attorney, Agent, or Firm*—Posz Law Group, PLC (57) ABSTRACT

A mounting structure for a current sensor is provided. The current sensor is arranged between a negative terminal of a battery and a grounding unit. The mounting structure includes a battery grounding cable which has one end connected with the negative terminal of the battery, and a fixing unit which is electrically conductive to electrically connect other end of the battery grounding cable with the grounding unit. The fixing unit and the battery grounding cable constructs a current path which connects the negative terminal with the grounding unit. The current sensor is fixed by the fixing unit to the grounding unit, and disposed to detect current flowing through the fixing unit.

17 Claims, 4 Drawing Sheets

MOUNTING STRUCTURE FOR CURRENT SENSOR

CROSS REFERENCE TO RELATED APPLICATION

This application is based on a Japanese Patent Application No. 2005-223297 filed on Aug. 1, 2005, the disclosure of which is incorporated herein by reference.

FIELD OF THE INVENTION

The present invention relates to a mounting structure for a current sensor, which has a magnetism-electricity converting element and is arranged between a grounding unit and a negative terminal of a battery or the like.

BACKGROUND OF THE INVENTION

Generally, a current sensor is provided with a mounting structure with reference to JP-2004-219303A, for example. The current sensor has a magnetism-electricity converting element and is arranged between a negative terminal of a battery and a grounding member.

In this case, the current sensor includes a core and a Hall element (magnetism-electricity converting element), and is provided with a through hole. The current sensor is press-fitted with a grounding terminal (or proximity thereof) of a battery grounding cable, which is connected with the negative terminal of the battery.

However, in this case, the grounding terminal is screw-fastened to the grounding member via a screw or the like. Thus, the current sensor is separated from the grounding member via the screw, so that the reliability of the electrical connection between the grounding member and the battery grounding cable will be deteriorated due to vibration of the current sensor which is excited by vibration of a vehicle or the like. Specifically, there may occur a rupture of the grounding terminal due to resonance, a fatigue failure of the grounding terminal due to cyclic stress, a screw detachment from the grounding member and the like.

Moreover, a looseness of the press-fit construction due to the vibration (that is, a decrease of reliability of mechanical connection), and a position deviation of the current sensor may be caused. Especially, in the case where the current sensor is provided with the core, the vibration will become violent because of the large weight of the core. Thus, the reliability of the mechanical and/or electrical connection is liable to decrease.

Referring to JP-2004-219303A, it is further disclosed a structure where the current sensor is fixed at the grounding member via a bracket. In this case, the current sensor is also positioned away from the grounding member. Therefore, similarly, the above-described problems will be caused.

SUMMARY OF THE INVENTION

In view of the above-described disadvantages, it is an object of the present invention to provide a mounting structure for a current sensor to improve an electrical connection reliability and a mechanical connection reliability.

According to the present invention, a mounting structure for a current sensor is provided. The current sensor has a magnetism-electricity converting element, and is arranged between a negative terminal of a battery and a grounding unit. The mounting structure includes a battery grounding cable which has one end connected with the negative terminal of the battery, and a fixing unit which is electrically conductive to electrically connect other end of the battery grounding cable with the grounding unit. The fixing unit and the battery grounding cable constructs a current path which connects the negative terminal with the grounding unit. The current sensor is fixed by the fixing unit to the grounding unit, and disposed to detect current flowing through the fixing unit.

In this case, the fixing unit for electrically connecting the battery grounding cable with the grounding unit is used to fix the current sensor with respect to the grounding unit. The current sensor which is fixed detects the current flowing through the fixing unit. That is, the current sensor is mounted at the fixing unit. Therefore, the vibration of the current sensor can be restricted even when vehicle vibration or the like is applied to the current sensor. Thus, the reliability of the electrical/mechanical connection can be improved.

Moreover, the fixing unit doubles as a fixing device for the current sensor and that for the battery grounding cable, so that the component number can be reduced.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE EXAMPLE EMBODIMENTS

First Embodiment

A mounting structure for a current sensor 40 according to a first embodiment of the present invention will be described with reference to FIGS. 1-4.

Figure 1:
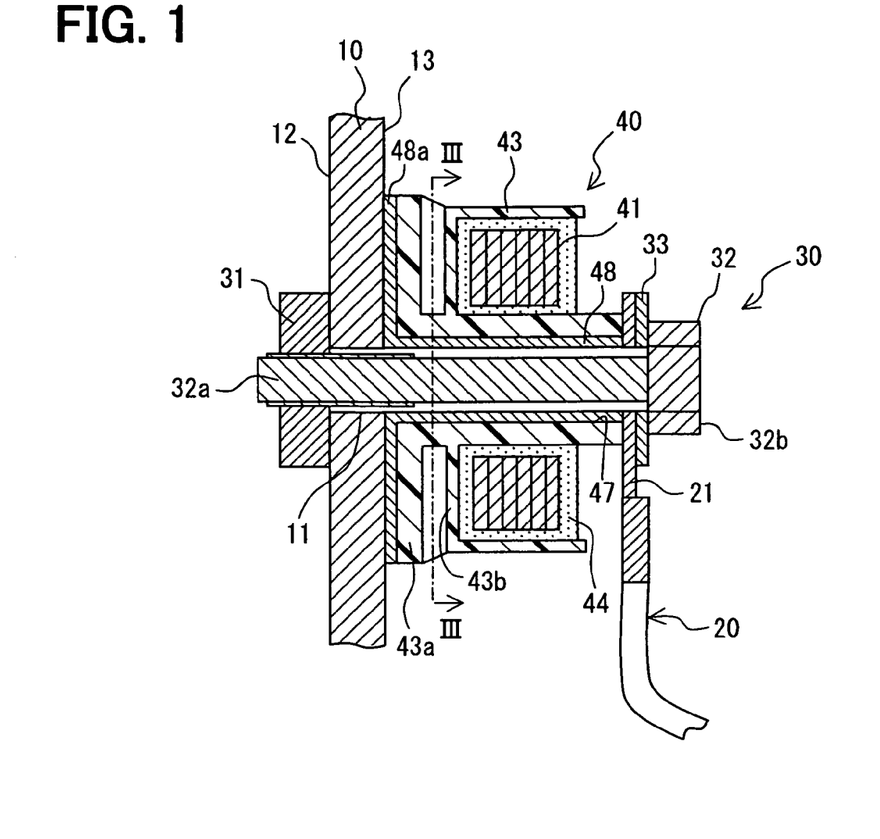
FIG. 1 is a schematic sectional view showing a mounting structure for a current sensor according to a first embodiment of the present invention.

As shown in FIG. 1, the mounting structure includes a battery grounding cable 20 which has one end connected with a negative terminal (pole) of a battery or the like (not shown), and a fixing unit 30 which is electrically conductive to electrically connect other end of the battery grounding cable 20 with a grounding unit 10. The battery grounding cable 20 and the fixing unit 30 construct a current path which connects the negative terminal of the battery with the grounding unit 10. The current sensor 40 is fixedly mounted at the fixing unit 30 to be fixed with respect to the grounding unit 10, and disposed to detect the current flowing through the fixing unit 30.

The grounding unit 10 is constructed of an electrically conductive member such as a chassis of a vehicle, an engine, an intake manifold or the like. In this embodiment, the vehicle chassis is used as the grounding unit 10. The grounding unit 10 is provided with a through hole 11, through which the fixing unit 30 is inserted.

The battery grounding cable 20 electrically connects the negative terminal of the battery with the grounding unit 10. The battery grounding cable 20 (which can be constructed of well-known cable) has an annular-shaped end portion 21 at the side of the grounding unit 10. The end portion 21 is constructed in such a manner that the fixing unit 30 can be inserted through the end portion 21. The end portion 21 is electrically connected with the fixing unit 30.

The fixing unit 30, being constructed of an electrically conductive material, fixes the battery grounding cable 20 and the current sensor 40 respectively at predetermined positions with respect to the grounding unit 10. In this embodiment, the fixing unit 30 is a clamping unit (e.g., fastening unit) for clamping the end portion 21 of the battery grounding cable 20 and the current sensor 40 between the fixing unit 30 and the grounding unit 10. Specifically, the end portion 21 of the battery grounding cable 20 and the current sensor 40 are fastened via the fixing unit 30.

For example, the fastening unit 30 can be constructed of a nut 31 and a bolt 32 which are coupled with each other. The nut 31 is beforehand fixed (e.g., by welding) at a back surface 12 of the grounding unit 10 in such a manner that the nut 31 is matched to the through hole 11. The back surface 12 is at an opposite side to a surface 13 of the grounding unit 10. The end portion 21 of the battery grounding cable 20 and the current sensor 40 are mounted at the grounding unit 10 at the side of the surface 13.

The bolt 32 is inserted through the through hole 11 from the surface 13 of the grounding unit 10. The bolt 32 has a shaft portion 32a which is engaged (fastened) with the nut 31, and a head portion 32b which is arranged at a rear end (with respect to insertion direction of bolt 32 to nut 31) of the shaft portion 32a. That is, the head portion 32b is positioned at the opposite end of the bolt 32 to an end thereof which is engaged with the nut 31. The shaft portion 32a extends from the head portion 32b in the substantial insertion direction.

The length of the shaft portion 32a is set so that the end portion 21 of the battery grounding cable 20 and the current sensor 40 can be clamped between the surface 13 of the grounding unit 10 and the head portion 32b (flange) in the case where the shaft portion 32a is engaged with the nut 31.

That is, the shaft portion 32a is inserted through the through hole 11 of the grounding unit 10 to be fastened to the grounding unit 11 by the nut 31, which is arranged at the opposite side of the grounding unit 11 to the head portion 32b of the bolt 32.

Moreover, the fixing unit 30 can be constructed of a material (e.g., brass) which is electrically conductive and non-magnetic. Thus, it is unnecessary to consider the influence of the magnetic property of the fixing unit 30 when current flows in the fixing unit 30 through the battery grounding cable 20. Therefore, the detection accuracy of the current sensor 40 can be improved.

A washer 33 is sandwiched between the head portion 32b and the end portion 21. As shown in FIG. 1, the head portion 32b of the bolt 32, the washer 33, the end portion 21 of the battery grounding cable 20, the current sensor 40 and the grounding unit 10 are sequentially arranged in the insertion direction of the bolt 32 with respect to the nut 31. In this case, the adjacent components contact with each other. Alternatively, the washer 33 can be also omitted.

Figure 2:
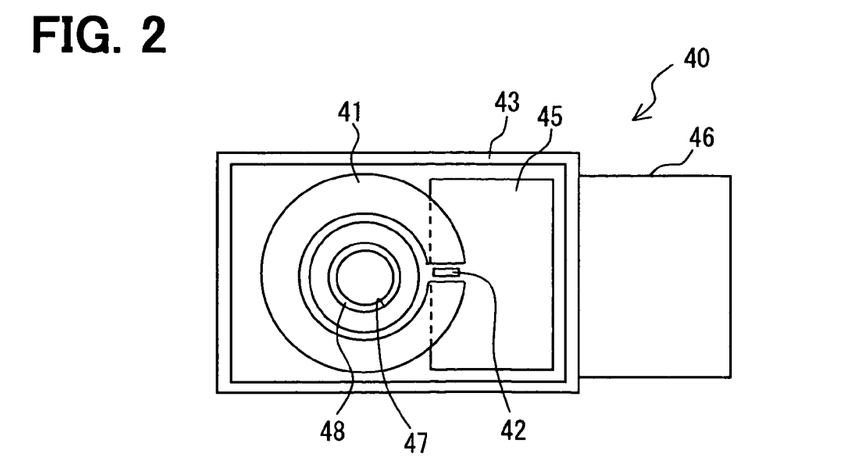
FIG. 2 is a schematic plan view showing a construction of the current sensor according to the first embodiment.

The current sensor 40 is constructed to be capable of detecting magnetic flux of a magnetic field which is generated by the current flowing in the fixing unit 30. As shown in FIGS. 1 and 2, the current sensor 40, being magnetism proportionality type, for example, can be constructed as well known. For example, the current sensor 40 has a substantially C-shaped flux concentration core 41, and a magnetism-electricity converting element 42 (e.g., Hall element) which is arranged in the circumferential gap of the flux concentration core 41. The gap is a space between opened (separated) ends of the flux concentration core 41.

The flux concentration core 41 can be constructed of multiple members which are stacked (for example, coupled) with each other. The members can be acquired, for example, by cutting a magnetic material such as iron, iron alloy, permalloy or the like. The magnetic flux which is generated in the flux concentration core 41 due to the current flowing in the bolt 32 of the fixing unit 30 can be detected by the Hall element 42, which is arranged in the gap. Thus, the current intensity can be detected by the current sensor 40.

In this embodiment, the current sensor 40 is provided with a case 43 which is electrical insulating and non-magnetic. The flux concentration core 41 and the Hall element 42 are arranged in the case 43. Thus, the flux concentration core 41 and the Hall element 42 are electrical insulated from the grounding unit 10, the end portion 21 of the battery grounding cable 20, the fixing unit 30 and the washer 33. That is, the current sensor 40 is sandwiched between the surface 13 of the grounding unit 10 and the head portion 32b of the bolt 32 via the case 43.

The case 43 which is electrical insulating and non-magnetic can be made of a resin and formed by an ejection forming, for example. The flux concentration core 41 and the Hall element 42 are arranged in the case 43 in such a manner that a potting material such as silicon, urethane or the like which is electrical insulating is filled in the case 43. With the potting material hardening to construct the potting member 44, the flux concentration core 41 and the Hall element 42 are sealed in the case 43 by the potting member 44. In the case 43, the flux concentration core 41 and the Hall element 42 are fixed with a predetermined position relation therebetween.

Referring to FIG. 2 where the potting member 44 is not shown, the Hall element 42 is mounted at a circuit board 45, which is electrically connected with a connector 46. Detection signals of the Hall element 42 are outputted to the exterior through the connector 46.

The case 43 is provided with an insertion hole 47, through which the bolt 32 of the fixing unit 30 (for substantially C-shaped flux concentration core 41) can be inserted. The insertion hole 47 can be arranged at a substantial center of mass position of the current sensor 40.

Because the insertion hole 47 is arranged at the substantial center of mass position of the current sensor 40, the vibration of the current sensor 40 can be reduced even when the vibration of the vehicle is transmitted to the current sensor 40 through the grounding unit 10 which is constructed of the vehicle chassis. That is, the electrical/mechanical connection reliability of the current sensor 40 can be improved.

Alternatively, the insertion hole 47 can be also arranged at a substantial center position of the current sensor 40. Thus, the electrical/mechanical connection reliability can be improved, although the improvement is little inferior to the case where the insertion hole 47 is arranged at the substantial center of mass position of the current sensor 40.

A reinforcement member 48 (e.g., reinforcement plate) is integrated with the surface of the insertion hole 47 of the case 43, to reinforce the case 43. Thus, the endurance of the case 43 can be improved when the case 43 is clamped by the fixing unit 30. For example, when the case 43 is formed by the ejection of the resin material, the reinforcement member 48 can be inserted in a mold for forming the case 43 to be integrated with the case 43. The reinforcement member 48 can be constructed of a material (e.g., metal, resin and ceramic) which is non-magnetic and has a higher stiffness than the resin constructing the case 43.

As shown in FIG. 1, the reinforcement member 48 has a substantial cylinder shape. The reinforcement member 48 is provided with an extension portion 48a at an axial end thereof of the side of the grounding unit 10. The extension portion 48a extends along the surface 13 of the grounding unit 10 to widely contact the grounding unit 10. In this case, because the reinforcement member 48 is arranged at the inner side of the insertion hole 47 of the case 43, the cylindrical inner surface of the reinforcement member 48 constructs an insertion hole through which the shaft portion 32a of the bolt 32 is inserted.

Alternatively, the reinforcement member 48 can be also completely embedded in the resin constructing the case 43. More alternatively, the reinforcement member 48 can be omitted.

In the case where the grounding unit 10 is constructed of the magnetic material, a part of the magnetic flux which should have passed the flux concentration core 41 flows through the grounding unit 10 (constructed of vehicle chassis) when the distance between the flux concentration core 41 and the grounding unit 10 is small (e.g., the distance is smaller than 10 mm). Thus, the detection sensitivity of the current sensor 40 will be decreased.

According to this embodiment, the case 43 which is non-magnetic and electrical insulating is arranged between the grounding unit 10 and the flux concentration core 41. The shape and/or thickness of the case 43 can be adjusted to provide a predetermined distance between the flux concentration core 41 and the grounding unit 10, so that the magnetic flux does not function at the grounding unit 10.

As described above, the case 43 is provided with the insertion hole 47, through which the bolt 32 of the fixing unit 30 is inserted. The case 43 has a housing member (containing member) which defines a space to contain the flux concentration core 41 and the like, and an end member 43a which is positioned at the side of the grounding unit 10. The end member 43a contacts the extension portion 48a of the reinforcement member 48. That is, the end member 43a of the case 43 and the surface 13 of the grounding unit 10 respectively contact the two opposite sides of the extension portion 48a.

The housing member of the case 43 has a tubelike portion (insertion portion) which extends from the end member 43a and defines the insertion hole 47 (through hole) positioned at the substantial center of mass position or the like of the current sensor 40. The flux concentration core 41 is arranged in the housing member in such a manner that the tubelike portion protrudes from (is inserted through) the inner side of the substantially C-shaped flux concentration core 41.

The housing member of the case 43 has an end portion 43b (i.e., bottom at the side of grounding unit 10), which faces the end member 43a. At least one rib 43c is arranged between the bottom 43b of the housing member and the end member 43a of the case 43 to partially connect the end member 43a and the bottom 43b, referring to FIGS. 1 and 3 (where multiple ribs 43c are provided to further improve strength).

Figure 3:
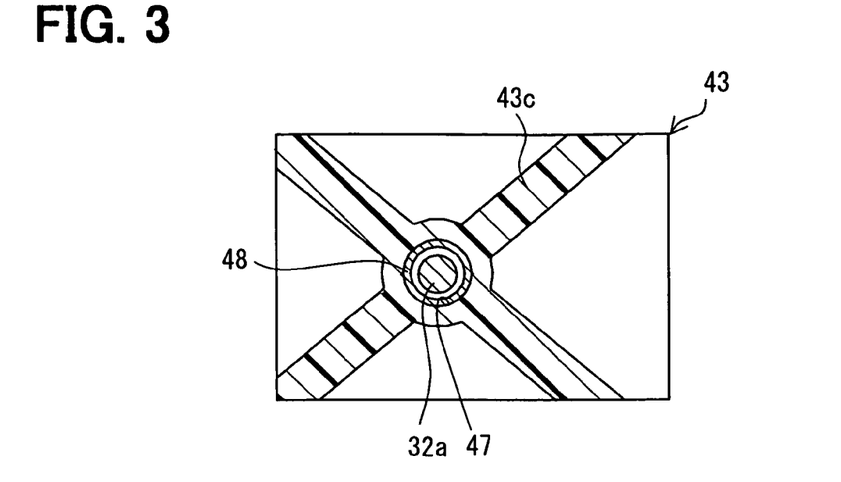
FIG. 3 is a vertical sectional view which is taken along a line III-III in FIG. 1 to show ribs according to the first embodiment.

Thus, the predetermined distance between the grounding unit 10 and the flux concentration core 41 arranged in the housing member can be maintained by the rib 43c. That is, in this case, the predetermined distance is maintained, not by filling the space between the end member 43a and the bottom 43b with the resin without gap.

In the case where the predetermined distance between the grounding unit 10 and the flux concentration core 41 is maintained via the resin or the like (with which space between end member 43a and bottom 43b is filled), pores (blowholes) may be generated when the case 43 is formed by the ejection of the resin, for example. Thus, the forming will become difficult. According to this embodiment, the predetermined distance is maintained by providing the case 43 with the rib 43c so that the amount of the ejected resin is decreased. Thus, the forming is simplified. Moreover, because the end member 43a is partially connected with the bottom 43b via the rib 43c, the weight of the current sensor 40 can be reduced while the strength thereof can be maintained. That is, the current sensor 40 is constructed to be substantially resistant from the vibration. Thus, the connection reliability of the mounting structure is further improved.

According to the mounting structure of this embodiment, the current sensor 40 is fixed with respect to the grounding unit 10 via the fixing unit 30, which electrically connects the battery grounding cable 20 with the grounding unit 10. The current sensor 40 which is fixed detects the current flowing through the bolt 32 of the fixing unit 30. That is, the current sensor 40 is mounted at the fixing unit 30. Therefore, the vibration of the current sensor 40 can be restricted even when the vibration of the vehicle is applied to the current sensor 40 through the grounding unit 10. Accordingly, the reliability of the electrical/mechanical connection is improved as compared with a conventional mounting structure.

Moreover, because the current sensor 40 is fixed with respect to the grounding unit 10 by the fixing unit 30 through which the battery grounding cable 20 is fixed, the component number of the mounting structure can be reduced as compared with the conventional structure.

The fixing unit 30 is constructed of the nut 31 and the bolt 32 for fastening the current sensor 40 between the fixing unit 30 and the grounding unit 10. Thus, the current sensor 40 can be substantially held (fixed) at the predetermined position via a simple construction.

As shown in FIG. 1, the inner diameters of the insertion hole 47 (reinforcement member 48) and the through hole 11 are larger than the diameter of the shaft portion 32a. Alternatively, it can be also set that at least one of the inner diameters of the insertion hole 47 (reinforcement member 48) and the through hole 11 is substantially equal to or slightly larger than the diameter of the shaft portion 32a. In this case, it is desirable that both of the inner diameters of the insertion hole 47 (reinforcement member 48) and the through hole 11 are substantially equal to or slightly larger than the diameter of the shaft portion 32a. Thus, the current sensor 40 can be fixed with a further stability.

Alternatively, the fixing unit 30 (fastening unit) can be also constructed of other components. For example, according to a modification of the first embodiment with reference to FIG. 4, the fastening unit 30 is constructed of a swaging member 34. Two end portions 34a of the swaging member 34 can be swaged by riveting or heat-swaging or the like. The end portions 34a are respectively arranged at two opposite sides of a shaft portion 34b of the swaging member 34.

Figure 4:
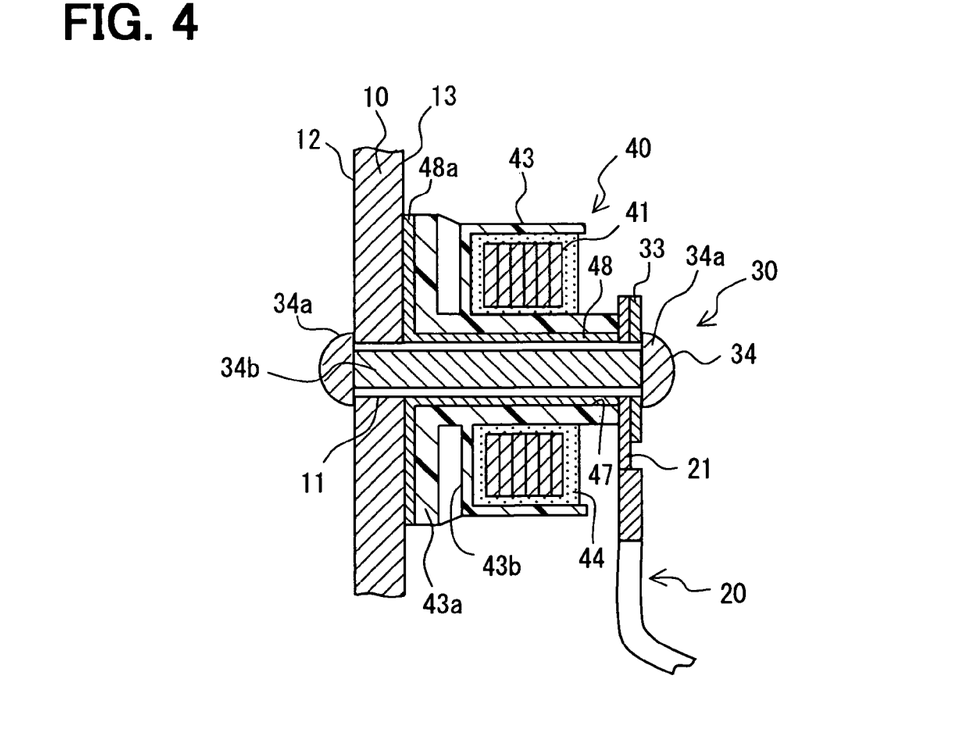
FIG. 4 is a schematic sectional view showing a mounting structure for a current sensor according to a modification of the first embodiment.

The shaft portion 34b is inserted through the insertion hole 47 (reinforcement plate 48) of the case 43, and the end portions 34a are respectively swaged to contact the surface 12 of the grounding unit 10 and the washer 33. Thus, the current sensor 40 can be fixed with respect to the grounding unit 10 by the fastening unit 30.

In this case, in addition to the above-described effects, the component number of the mounting structure can be further reduced because the nut 31 is omitted.

Second Embodiment

Figure 5:
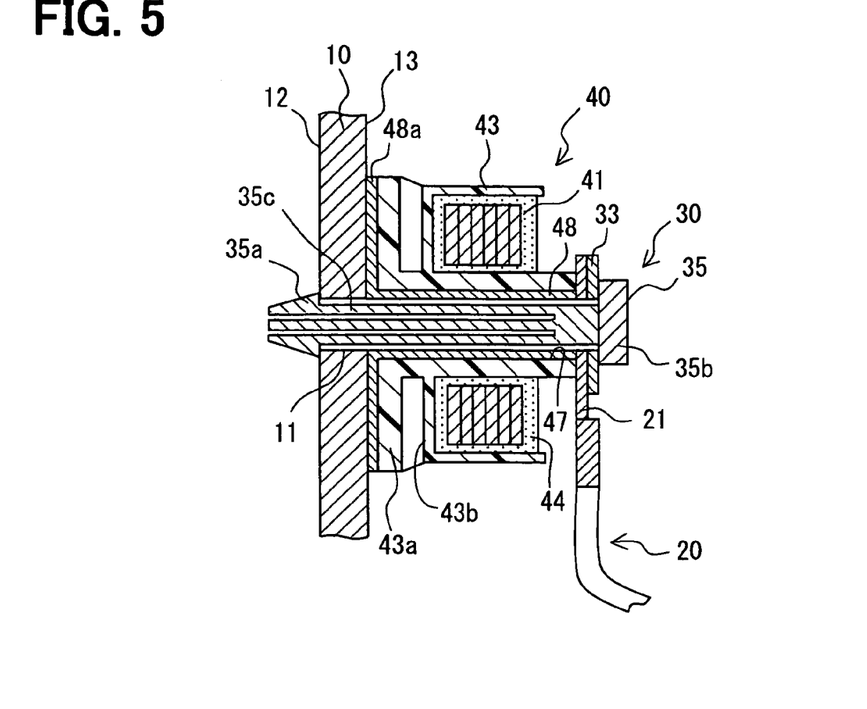
FIG. 5 is a schematic sectional view showing a mounting structure for a current sensor according to a second embodiment of the present invention.

A second embodiment of the present invention will be described with reference to FIG. 5. As shown in FIG. 5, the fixing unit 30 is constructed of an engagement member 35 which is elastic.

The engagement member 35 (e.g., snap-fit member) is constructed in such a manner that one end side thereof is engaged with the back surface 12 of the grounding unit 10 to be electrically connected with the grounding unit 10 and the current sensor 40 is sandwiched (clamped) between other end side thereof and the grounding unit 10. The engagement member 35 is inserted through the through hole 11 so that the two end sides are respectively arranged at the opposite sides of the grounding unit 10.

The engagement member 35 is inserted through the insertion hole 47 of the current sensor 40 and the through hole 11 of the grounding unit 10. The engagement member 35 can be provided with an engagement portion 35a for coupling with the back surface 12 of the grounding unit 10, a head portion 35b for clamping the current sensor 40 between the head portion 35b and the grounding unit 10, and a pole portion 35c for connecting the engagement portion 35a with the head portion 35b.

A part of the pole portion 35c has a substantial tube shape. The part of the pole portion 35c has a predetermined length (depth) from the insertion-side tip (where engagement portion 35a is arranged) of the pole portion 35c. The engagement member 35 (e.g., periphery thereof) is provided with at least one slit, which can be arranged at the head portion 35a and the tubelike part of the pole portion 35c and extend in the insertion direction (with respect to through hole 11) of the engagement member 35.

That is, the engagement member 35 is elastically deformable so that the engagement portion 35a can be inserted through the insertion hole 47 (reinforcement member 48) of the current sensor 40 and the through hole 11 of the grounding unit 10.

The engagement portion 35a which is inserted through the through hole 11 will have a spring back to couple with the back surface 12 (around through hole 11) of the grounding unit 10. The length of the pole portion 35c is set so that the end portion 21 of the battery grounding cable 20 and the current sensor 40 can be clamped between the head portion 35b and the surface 13 of the grounding unit 10 through the washer 33 in the state where the engagement portion 35a is engaged with the back surface 12 of the grounding unit 10.

Thus, according to this embodiment, the current sensor 40 is fixed with respect to the grounding unit 10 via the fixing unit 30, which electrically connects the battery grounding cable 20 with the grounding unit 10. The current sensor 40 which is fixed detects the current flowing through the engagement member 35 which constructs the fixing unit 30. That is, the current sensor 40 is mounted at the fixing unit 30. Therefore, the vibration of the current sensor 40 can be restricted even when the vibration of the vehicle is applied to the current sensor 40 through the grounding unit 10. Accordingly, the reliability of the electrical/mechanical connection of the mounting structure is improved as compared with the conventional structure.

Moreover, because the current sensor 40 is fixed with respect to the grounding unit 10 by the fixing unit 30 through which the battery grounding cable 20 is fixed, the component number of the mounting structure is reduced as compared with the conventional structure.

Moreover, because the engagement member 35 having the snap-fit construction is used as the fixing unit 30, the engagement member 35 can be attached to the grounding unit 10 through the through hole 11 by one-touch, by being inserted through the washer 33, the end portion 21 of the battery grounding cable 20 and the current sensor 40. Thus, the current sensor 40 can be substantially held (fixed) at the predetermined position via simple construction and attachment.

In the second embodiment, what has not been described about the mounting structure and the current sensor 40 is the same with the first embodiment.

Third Embodiment

A third embodiment of the present embodiment will be described with reference to FIG. 6. In the third embodiment, referring to FIG. 6, the fixing unit 30 is press-fitted into the insertion hole 47 of the current sensor 40 so that the current sensor 40 is fixed to the fixing unit 30 which is fixedly attached to the grounding unit 10, as compared with the first and second embodiments where the current sensor 40 is clamped between the fixing unit 30 and the grounding unit 10.

That is, the current sensor 40 can be also fixed by methods other than the clamping. The fixing method of the current sensor 40 (with respect to grounding unit 10) via the fixing unit 30 is not limited if the current sensor 40 can be fixed by the fixing unit 30 at the predetermined position with respect to the grounding unit 10 and the current sensor 40 can detect the current flowing through the fixing unit 30. For example, the current sensor 40 can be fixed to the fixing unit 30 by engaging, bonding or the like, in addition to clamping and press-fitting.

Figure 6:
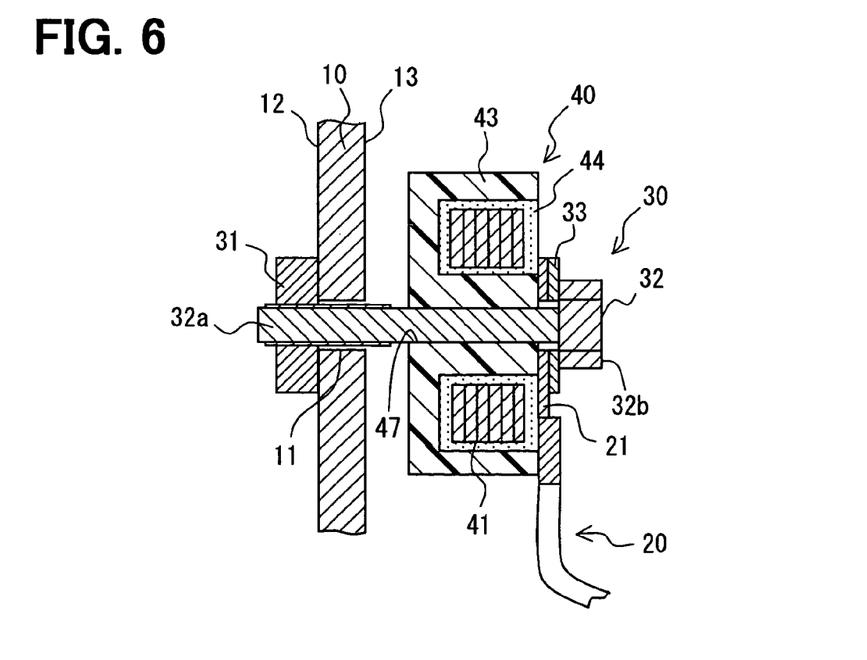
FIG. 6 is a schematic sectional view showing a mounting structure for a current sensor according to a third embodiment of the present invention.

Referring to FIG. 6, the current sensor 40 is press-fitted to be fixedly attached to the shaft portion 32a of the bolt 32 of the fixing unit 30. In this case, the case 43 of the current sensor 40 can be arranged without contacting the surface 13 of the grounding unit 10. The electrical connection between the battery grounding cable 20 and the bolt 32 can be ensured because the current sensor 40 is pressed against the bolt 32 through the washer 33 and the end portion 21 of the battery grounding cable 20. In this case, the distance between the grounding unit 10 and the flux concentration core 41 can be maintained, because the case 43 is separated from the grounding unit 10. Referring to FIG. 6, the reinforcement member 48 can be omitted.

In the third embodiment, what has not been described about the mounting structure and the current sensor 40 is the same with the first embodiment.

Other Embodiments

Although the present invention has been fully described in connection with the preferred embodiments thereof with reference to the accompanying drawings, it is to be noted that various changes and modifications will become apparent to those skilled in the art.

In the above-described embodiments, the current sensor 40 has the case 43, in which the flux concentration core 41 and the magnetism-electricity converting element 42 are arranged and the potting member 44 is filled in the gap therebetween. However, the current sensor 40 can be also provided with other construction.

Figure 7:
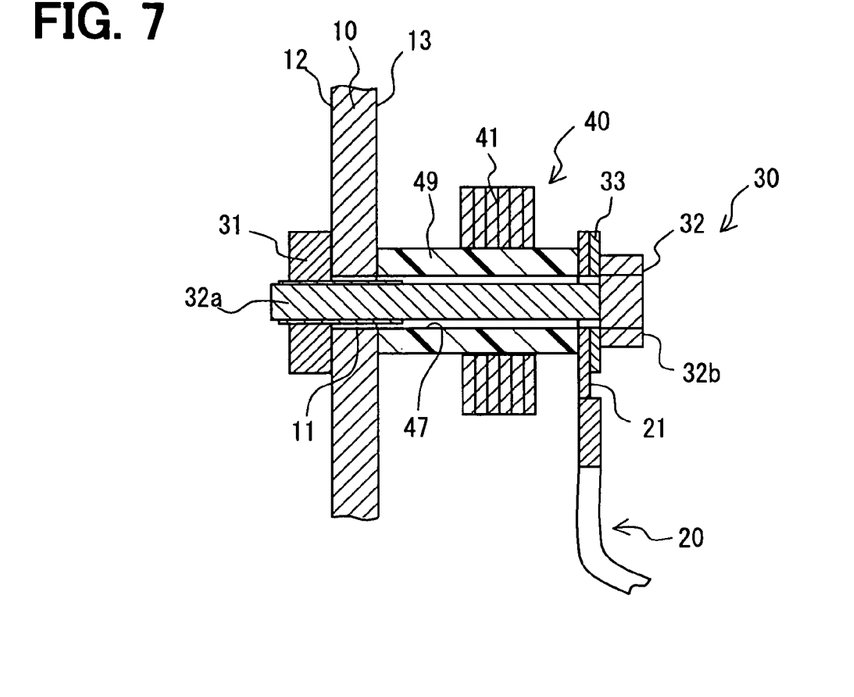
FIG. 7 is a schematic sectional view showing a mounting structure for a current sensor according to other embodiments of the present invention.

For example, as shown in FIG. 7, the current sensor 40 is provided with an electrical insulating member 49 instead of the case 43. The electrical insulating member 49 is non-magnetic. The flux concentration core 41 and the magnetism-electricity converting element 42 are fixedly attached to the electrical insulating member 49 (e.g., outer surface thereof), which is clamped between the head portion 32b of the bolt 32 of the fixing unit 30 and the surface 13 of the grounding unit 10. The electrical insulating member 49 can define the insertion hole 47, through which the shaft portion 32a of the bolt 32 is inserted to protrude from the through hole 11 of the grounding unit 10. In this case, the flux concentration core 41 is separated from the grounding unit 10 so that the predetermined distance therebetween can be maintained.

That is, the current sensor 40 can be provided with any construction, via which the current sensor 40 is fixed by the fixing unit 30 in such a manner that the fixing unit 30 is inserted through the flux concentration core 41 with the electrical insulating member 49 interposed therebeween.

Moreover, the magnetism-electricity converting element is not limited to the Hall element 42. That is, the magnetism-electricity converting element can be constructed of any apparatus where the current intensity can be detected by the detection of the magnetic flux of the magnetic field generated by the current flowing through the fixing unit 30. For example, the magnetism-electricity converting element can be constructed of a magnetoresistive effect element.

Figure 8:
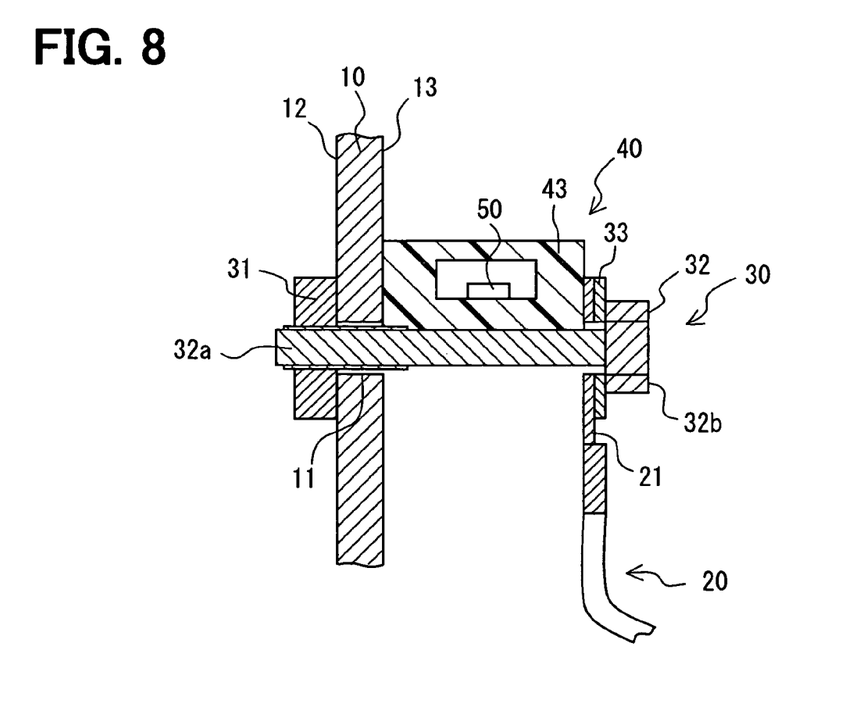
FIG. 8 is a schematic sectional view showing a mounting structure for a current sensor according to the other embodiments.

For example, referring to FIG. 8, the current sensor 40 is provided with a tunnel magnetoresistance effect element 50 which is arranged in the case 43. The current sensor 40 is attached to the shaft portion 32a of the bolt 32 of the fixing unit 30, and clamped between the head portion 32b of the bolt 32 and the surface 13 of the grounding unit 10. In this case, the current sensor 40 can be arranged to contact or non-contact the shaft portion 32a. The fixing unit 30 can be arranged at the one side of the current sensor 40 (case 43), as shown in FIG. 8.

Furthermore, the flux concentration core 41 can be also omitted. In the case where the flux concentration core 41 is not provided, the case 43 can be also provided with the insertion hole 47, through which the fixing unit 30 is inserted so that the current sensor 40 is fixed.

Such changes and modifications are to be understood as being in the scope of the present invention as defined by the appended claims.

What is claimed is:

1. A mounting structure for a current sensor which is arranged between a negative terminal of a battery and a grounding unit, the current sensor having a magnetism-electricity converting element, the mounting structure comprising:
    a battery grounding cable which has one end connected with the negative terminal of the battery;
    a fixing unit which is electrically conductive to electrically connect other end of the battery grounding cable with the grounding unit,
    the fixing unit and the battery grounding cable constructing a current path which connects the negative terminal with the grounding unit,
    the current sensor is fixed by the fixing unit to the grounding unit, and disposed to detect current flowing through the fixing unit; and
    an electrical insulating member which is non-magnetic, wherein
    the current sensor includes a substantially C-shaped flux concentration core having a circumferential gap, in which the magnetism-electricity converting element is arranged,
    the fixing unit fixes the current sensor with respect to the grounding unit, in such a manner that the fixing unit is inserted through the flux concentration core with the electrical insulating member interposed therebetween,
    the electrical insulating member is a case for housing the magnetism-electricity converting element and the flux concentration core,
    the case has an insertion hole which is through the case and positioned corresponding to the flux concentration core,
    the fixing unit fixes the current sensor to the grounding unit in such a manner that the fixing unit is inserted through the flux concentration core and the insertion hole of the case,
    the case is made of a resin, and
    the case has at least one rib which is made of the resin and arranged between a first portion of the case at a side of the grounding unit and a second portion of the case at a side of the flux concentration core, to partially connect the first portion of the case and the second portion of the case.

2. The mounting structure according to claim 1, wherein the current sensor is fixedly mounted at the fixing unit by one of a press-fitting of the fixing unit into the current sensor and an engaging of the fixing unit with the current sensor.

3. The mounting structure according to claim 1, wherein the fixing unit is constructed to clamp the current sensor between the fixing unit and the grounding unit.

4. The mounting structure according to claim 3, wherein:
    the grounding unit has a through hole;
    the fixing unit s a fastening unit, which protrudes from the through hole to be fastened to the grounding unit so that the fastening unit is electrically connected with the grounding unit; and
    the current sensor is clamped between an end portion of the fastening unit and the grounding unit.

5. The mounting structure according to claim 4, wherein the fastening unit is swaged to be fastened to the grounding unit and clamp the current sensor between the fastening unit and the grounding unit.

6. The mounting structure according to claim 3, wherein:
    the grounding unit has a through hole;
    the fixing unit is an engagement unit, which protrudes from the through hole to be engaged with the grounding unit so that the engagement unit is electrically connected with the grounding unit; and
    the current sensor is clamped between one end portion of the engagement unit and the grounding unit.

7. The mounting structure according to claim 1, wherein the insertion hole of the case is positioned at a substantial center of the current sensor.

8. The mounting structure according to claim 1, wherein the insertion hole of the case is arranged at a substantial center of mass position of the current sensor.

9. The mounting structure according to claim 1, further comprising
    a reinforcement member which is constructed of a non-magnetic material and integrated with an surface of the insertion hole of the case,
    wherein the case is made of a resin.

10. The mounting structure according to claim 1, wherein the fixing unit is constructed of a non-magnetic material.

11. The mounting structure according to claim 2, wherein the current sensor has an insertion hole, into which the fixing unit is press-fitted.

12. The mounting structure according to claim 3, further comprising
an electrical insulating member which is non-magnetic and clamped between the fixing unit and the grounding unit, wherein:
the magnetism-electricity converting element is housed in the electrical insulating member; and
the fixing unit fixes the current sensor with respect to the grounding unit, in such a manner that the fixing unit is arranged at one side of the electrical insulating member.

13. The mounting structure according to claim 4, wherein:
the fastening unit includes a nut and a bolt, which has a head portion and a shaft portion extending from the head portion;
the shaft portion is inserted through the through hole of the grounding unit to be fastened to the grounding unit by the nut, which is arranged at an opposite side of the grounding unit to the head portion of the bolt; and
the current sensor is clamped between the head portion of the bolt and the grounding unit.

14. The mounting structure according to claim 6, wherein the engagement unit includes:
an engagement portion which couples with the grounding unit;
a head portion which clamps the current sensor between the head portion and the grounding unit; and
a pole portion which connects the engagement portion with the head portion,
the engagement portion and the head portion being respectively positioned at two opposite sides of the grounding unit.

15. The mounting structure according to claim 9, wherein the reinforcement member has an extension portion which extends along a surface of the grounding unit and contacts the surface.

16. The mounting structure according to claim 9, wherein the non-magnetic material of the reinforcement member has a larger stiffness than the resin of which the case is made.

17. The mounting structure according to claim 1, wherein the grounding unit is arranged at a vehicle, where the current sensor is fixed via the fixing unit.

* * * * *